(12) United States Patent
Gutman et al.

(10) Patent No.: US 10,197,922 B2
(45) Date of Patent: Feb. 5, 2019

(54) FOCUS METROLOGY AND TARGETS WHICH UTILIZE TRANSFORMATIONS BASED ON AERIAL IMAGES OF THE TARGETS

(71) Applicant: KLA-Tencor Corporation, Milpitas, CA (US)

(72) Inventors: Nadav Gutman, Zichron Ya'aqov (IL); Yoel Feler, Haifa (IL); Vladimir Levinski, Migdal HaEmek (IL); Oded Kaminsky, Givat Shemuel (IL)

(73) Assignee: KLA-Tencor Corporation, Milpitas, CA (US)

( * ) Notice: Subject to any disclaimer, the term of this patent is extended or adjusted under 35 U.S.C. 154(b) by 85 days.

(21) Appl. No.: 15/302,052

(22) PCT Filed: Aug. 4, 2016

(86) PCT No.: PCT/US2016/045594
§ 371 (c)(1),
(2) Date: Oct. 5, 2016

(87) PCT Pub. No.: WO2017/024158
PCT Pub. Date: Feb. 9, 2017

(65) Prior Publication Data
US 2017/0212427 A1 Jul. 27, 2017

Related U.S. Application Data

(60) Provisional application No. 62/201,975, filed on Aug. 6, 2015.

(51) Int. Cl.
*G03F 7/20* (2006.01)
(52) U.S. Cl.
CPC .................. *G03F 7/70641* (2013.01)

(58) Field of Classification Search
CPC .................................................. G03F 7/70641
See application file for complete search history.

(56) References Cited

U.S. PATENT DOCUMENTS

| | | | | |
|---|---|---|---|---|
| 5,680,588 A | * | 10/1997 | Gortych | G03F 7/2022 430/30 |
| 6,509,952 B1 | * | 1/2003 | Govil | G03F 7/70141 355/52 |

(Continued)

FOREIGN PATENT DOCUMENTS

| | | |
|---|---|---|
| WO | 2013189724 | 12/2013 |
| WO | 2015080858 | 6/2015 |

OTHER PUBLICATIONS

ISA/KR, International Search Report for PCT/US2016/045594 dated Nov. 10, 2016.

(Continued)

*Primary Examiner* — Deoram Persaud
(74) *Attorney, Agent, or Firm* — Hodgson Russ LLP

(57) ABSTRACT

Focus metrology methods and modules are provided, which use aerial-images-based transformations to share measurement information derived from multiple targets and/or to design additional targets to specified compliant targets, which enable simple adjustment of focus targets to changing production conditions. Methods comprise positioning two or more focus targets in each wafer field, conducting focus measurements of the targets, transforming the focus measurements into a single set of results for each field, using a transformation between the targets that is based on the aerial images thereof, and deriving focus results from the single sets of results; and possibly designing the focus targets from specified targets using aerial image parameters of the specified targets.

20 Claims, 6 Drawing Sheets

(56) References Cited

U.S. PATENT DOCUMENTS

| | | | |
|---|---|---|---|
| 7,916,284 B2* | 3/2011 | Dusa | G03F 7/70516 356/124 |
| 7,921,383 B1* | 4/2011 | Wei | G03F 7/705 703/13 |
| 9,454,072 B2 | 9/2016 | Levinski et al. | |
| 9,678,421 B2 | 6/2017 | Levinski et al. | |
| 9,841,689 B1 | 12/2017 | Levinski et al. | |
| 9,934,353 B2* | 4/2018 | El Kodadi | G01N 21/4785 |
| 2004/0070771 A1 | 4/2004 | Ausschnitt | |
| 2004/0224242 A1 | 11/2004 | Izuha et al. | |
| 2005/0091633 A1* | 4/2005 | Ye | G03F 7/705 716/52 |
| 2005/0210437 A1* | 9/2005 | Shi | G03F 1/36 716/52 |
| 2006/0132749 A1* | 6/2006 | Bruls | G03F 7/70433 355/69 |
| 2006/0248497 A1* | 11/2006 | Huang | G03F 1/36 716/52 |
| 2007/0050749 A1* | 3/2007 | Ye | G03F 1/44 430/30 |
| 2008/0180647 A1 | 7/2008 | Sugino | |
| 2010/0128969 A1* | 5/2010 | Cao | G03F 7/705 382/144 |
| 2011/0224963 A1* | 9/2011 | Isoyan | G03F 7/705 703/14 |
| 2011/0249244 A1* | 10/2011 | Leewis | G03F 7/706 355/27 |
| 2012/0009509 A1* | 1/2012 | Hakko | G03F 1/36 430/5 |
| 2013/0204594 A1* | 8/2013 | Liu | G06F 17/5009 703/2 |
| 2014/0141536 A1 | 5/2014 | Levinski et al. | |
| 2015/0042984 A1* | 2/2015 | Pandev | G03F 9/7026 356/124 |
| 2015/0177135 A1* | 6/2015 | Amit | G01N 21/47 702/150 |
| 2015/0309402 A1* | 10/2015 | Levinski | G03F 1/42 356/247 |
| 2017/0045826 A1* | 2/2017 | Lee | G03F 7/70558 |

OTHER PUBLICATIONS

Mack, The Isofocal Point, Fundamental Principles of Optical Lithography: the science of microfabrication, John Wiley & Sons, Section 8.5.3, pp. 336-338 Jan. 1, 2008.

van Haver, et al., Wafer-based aberration metrology for lithographic systems using overlay measurements on targets imaged from phase-shift gratings, Applied Optics, vol. 53, No. 12, pp. 2562-2582 Apr. 20, 2014.

* cited by examiner

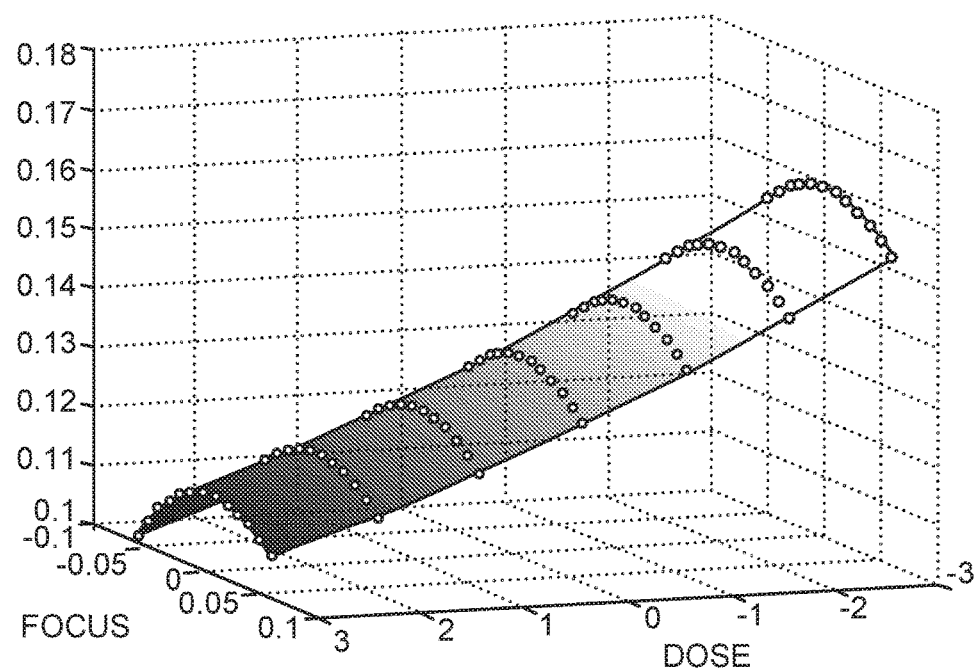
FIG. 2A
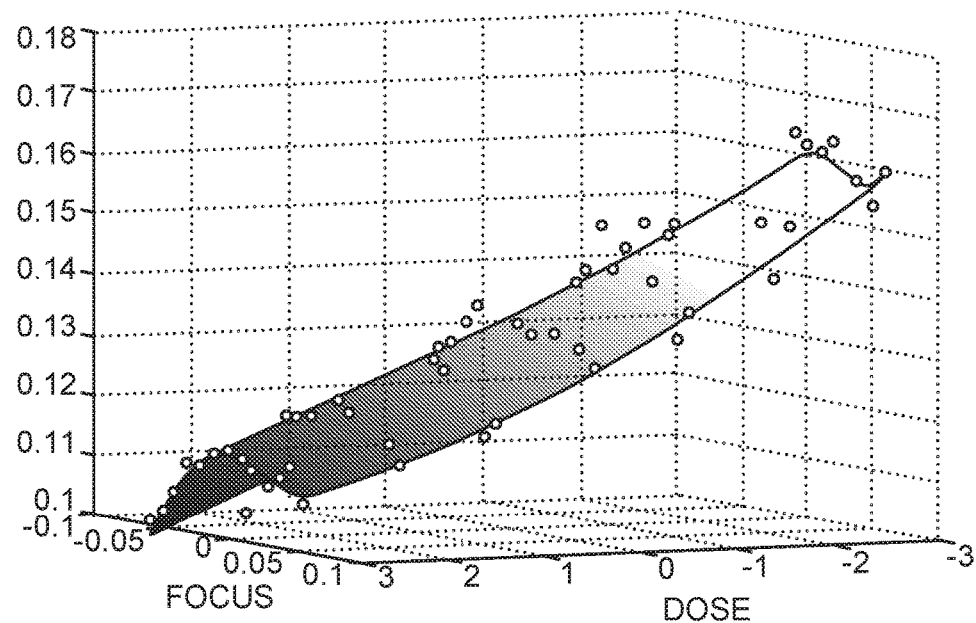
FIG. 2B – Prior art

FOCUS METROLOGY AND TARGETS WHICH UTILIZE TRANSFORMATIONS BASED ON AERIAL IMAGES OF THE TARGETS

CROSS REFERENCE TO RELATED APPLICATIONS

This application claims the benefit of U.S. Provisional Patent Application No. 62/201,975 filed on Aug. 6, 2015, which is incorporated herein by reference in its entirety.

BACKGROUND OF THE INVENTION

1. Technical Field

The present invention relates to the field of focus dose metrology, and more particularly, to measurement methods and target which improve focus and dose measurement accuracy and flexibility.

2. Discussion of Related Art

In Signal Response Metrology (SRM), the responses of signals are learned as the function of a few parameters of interest. Using a set of designated experiments, the parameters of interest are changed and the signals are measured. In the case of lithographic printing tool (such as scanner or a stepper) the focus and dose metrology are done using SRM with the focus and dose as parameters. A set of cells (i.e., a metrology target) is printed for different focus and dose values on a special wafer, namely the Focus Exposure Matrix (FEM) wafer. The learned signals may be derived by a corresponding metrology tool, e.g., implementing angle resolved scatterometry technology.

The inherent problems in SRM are the errors in the learned signals. In the case of focus metrology, the ambiguity in the FEM focus can be about 20 nm. These focus errors are expected on both the FEM and production wafers. Such a large ambiguity in scanner focus positions on FEM wafer doesn't allow creating a well-calibrated model and causes large errors in subsequent focus\dose measurements. Moreover, process variations, as in under-layers and resist, give rise to differences between the FEM and production printed patterns, and in turn of the measured signals.

Prior art focus dose measurements typically use two cells consisting of line-space patterns. One cell, termed Dense cell, has lines at a minimal pitch, and the other cell, termed ISO cell, has the same lines as the Dense cell but with a double pitch. While the ISO cell is very sensitive to both focus and dose the Dense cell is insensitive to focus. Hence, it is possible to de-correlate the focus from the dose contribution (see Mack, Chris 2008, Fundamental principles of optical lithography: the science of microfabrication, John Wiley & Sons). Asymmetric targets have asymmetric feature(s) which depend on focus and exposure. Such targets typically have a large pitch (400-900 nm), which enables to measure the differential signal between the first orders. Multiple targets with different pitch and asymmetry are used to de-correlate focus and dose (see WIPO Publication No. 2013/189724, which is incorporated herein by reference in its entirety).

SUMMARY OF THE INVENTION

The following is a simplified summary providing an initial understanding of the invention. The summary does not necessarily identify key elements nor limits the scope of the invention, but merely serves as an introduction to the following description.

One aspect of the present invention provides a focus metrology method comprising: positioning two or more focus targets in each wafer field, conducting focus measurements of the targets, transforming the focus measurements into a single set of results for each field, using a transformation between the targets that is based on the aerial images thereof, and deriving focus results from the single sets of results.

These, additional, and/or other aspects and/or advantages of the present invention are set forth in the detailed description which follows; possibly inferable from the detailed description; and/or learnable by practice of the present invention.

BRIEF DESCRIPTION OF THE DRAWINGS

For a better understanding of embodiments of the invention and to show how the same may be carried into effect, reference will now be made, purely by way of example, to the accompanying drawings in which like numerals designate corresponding elements or sections throughout.

In the accompanying drawings:

FIG. 2A schematically illustrates an idealized focus dose results derivation from measurements, and FIG. 2B schematically illustrates prior art focus dose results derivation from measurements.

DETAILED DESCRIPTION OF THE INVENTION

Figure 1:
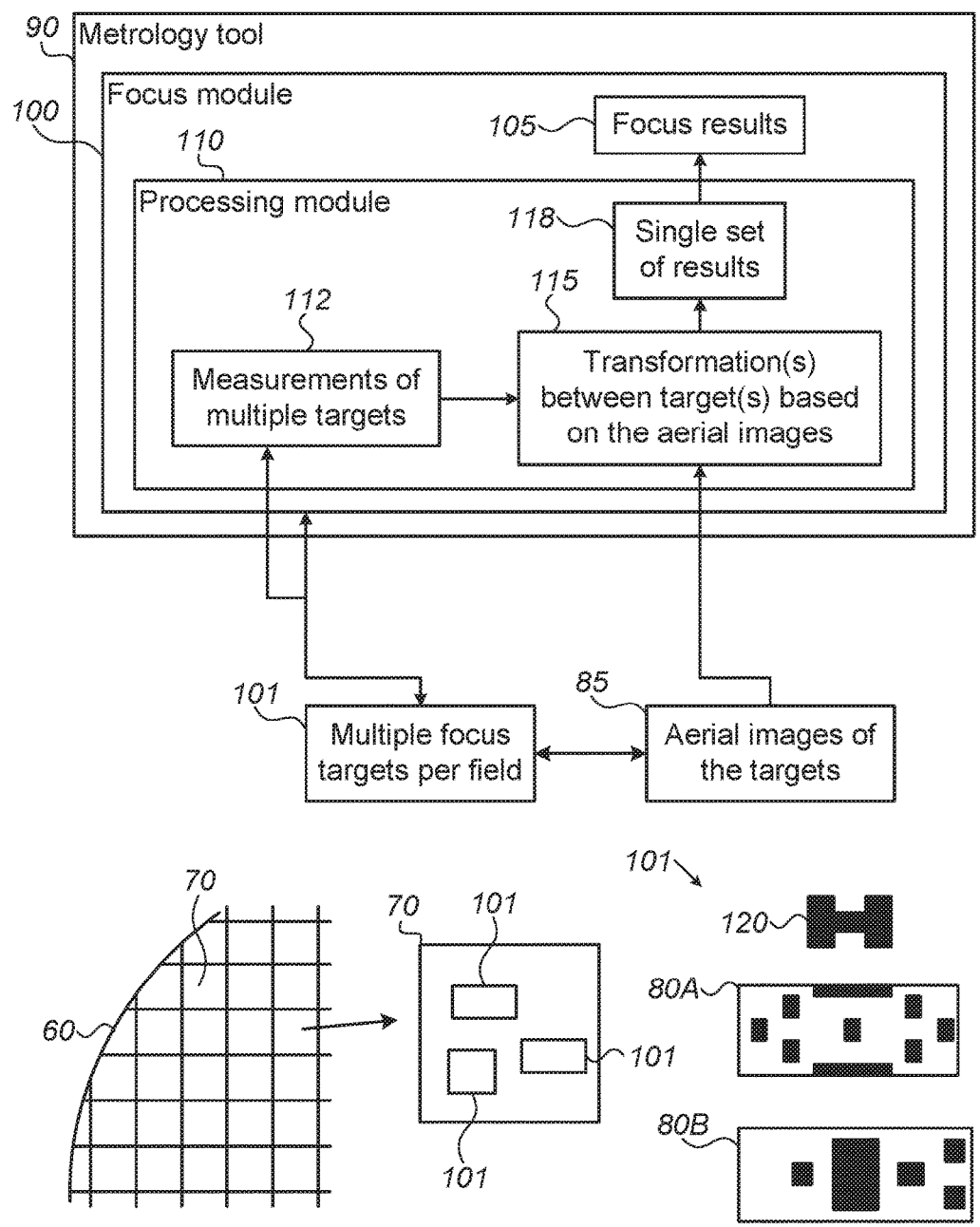
FIG. 1 is a high level schematic block diagram of a focus module in a metrology tool, according to some embodiments of the invention.

Prior to the detailed description being set forth, it may be helpful to set forth definitions of certain terms that will be used hereinafter.

The term "target" or "cell" as used in this application refers to a geometric pattern printed on a wafer, typically a target comprises one or more cells. The cells comprise one or more periodic patterns of elements, in the simplest, non-limiting case a grating composed of bars.

The term "aerial image" as used in this application refers to an optical image at a wafer plane, which upon interaction with the wafer is used to produce respective structures on the wafer. Generally the aerial image is a periodic pattern corresponding to the periodic structures of the target. Aerial images are illustrated herein with respect to a single element of respective targets.

In the following description, various aspects of the present invention are described. For purposes of explanation, specific configurations and details are set forth in order to provide a thorough understanding of the present invention. However, it will also be apparent to one skilled in the art that the present invention may be practiced without the specific details presented herein. Furthermore, well known features may have been omitted or simplified in order not to obscure the present invention. With specific reference to the drawings, it is stressed that the particulars shown are by way of example and for purposes of illustrative discussion of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments that may be practiced or carried out in various ways as well as to combinations of the disclosed embodiments. Also, it is to be understood that the phraseology and terminology employed herein is for the purpose of description and should not be regarded as limiting.

Unless specifically stated otherwise, as apparent from the following discussions, it is appreciated that throughout the specification discussions utilizing terms such as "processing", "computing", "calculating", "determining", "enhancing" or the like, refer to the action and/or processes of a computer or computing system, or similar electronic computing device, that manipulates and/or transforms data represented as physical, such as electronic, quantities within the computing system's registers and/or memories into other data similarly represented as physical quantities within the computing system's memories, registers or other such information storage, transmission or display devices.

Embodiments of the present invention provide efficient and economical method and mechanism for measuring focus and dose in metrology tools at high accuracy. The disclosed invention provides new methods of sharing information between printed cells of the metrology target, to improve both signals calibration and measurements by taking into consideration the computed aerial images of the cells' mask. In particular, the inventors have found out that using computed aerial images of cells with the same pitch may be used to improve focus and dose metrology. The disclosed invention may be implemented in any metrology platform, for use in focus and dose control, and may be combined with any type of focus\dose measurement which uses two or more cells with the same pitch, and with any tool head and with any measurement algorithm.

Focus metrology methods and modules are provided, which use aerial-images-based transformations to share measurement information derived from multiple targets and/or to design additional targets to specified compliant targets, which enable simple adjustment of focus targets to changing production conditions. Methods comprise positioning two or more focus targets in each wafer field, conducting focus measurements of the targets, transforming the focus measurements into a single set of results for each field, using a transformation between the targets that is based on the aerial images thereof, and deriving focus results from the single sets of results; and possibly designing the focus targets from specified targets using aerial image parameters of the specified targets.

FIG. 1 is a high level schematic block diagram of a focus module 100 in a metrology tool 90, according to some embodiments of the invention. Metrology focus module 100 comprises a processing module 110 configured to transform focus measurements 112 of multiple targets 101 positioned in a wafer field 70 of a wafer 60—into a single set 118 of results for field 70, using a transformation 115 between targets 101 that is based on aerial images 85 of targets 101. Metrology focus module 100 is configured to derive focus results 105 from single set(s) of results 118. Targets 101 may be selected from prior art targets 80A, 80B such as disclosed in U.S. Patent Publication No. 20140141536, may be modified therefrom or designed as targets 120, as explained below. Generic target designs taught by U.S. Patent Publication No. 20140141536 may be used as targets 80A, 80B and be modified correspondingly into targets 120, according to the guidelines provided below. In particular, targets 120 may comprise single pitch targets that enable to transfer information between them using transformation 115 as explained below.

Processing module 110 may be further configured to suggest focus target designs according to specified targets using aerial image parameters of the specified targets, wherein the specified targets are determined empirically from initial measurements carried out by metrology focus module 100. Certain measured targets 80A, 80B, 120 may be used as templates for deriving other target designs 120 using aerial-images-based transformation 115 as disclosed below.

FIG. 2A schematically illustrates an idealized focus dose results derivation from measurements, and FIG. 2B schematically illustrates prior art focus dose results derivation from measurements. In the current process, the signals calibration and measurement of each cell are done separately. No information is passed between cells to improve the measured signal. When using target cells with different pitches, and different symmetry, the aberration effect acts differently on each target. The different effects give rise to inaccuracy in the focus measurement, as shown by van Haver, Sven, et al. 2014, Wafer-based aberration metrology for lithographic systems using overlay measurements on targets imaged from phase-shift gratings, Applied Optics 53.12: 2562-2582. The response of the printed targets to focus and dose is calculated in the prior art for each cell separately, by min $\Sigma_i(SS_j(f^i, d^i)-S_j^i)$, where $S^i$ is the measured signal at each focus and dose value, i, for the cell j (denoted $f^i$, $d^i$, respectively) and $SS_j$ is a function that was learned during an earlier train stage, using the HEM wafer. The disadvantage of the current method is that it is highly affected from process variation (variation in the resist and underlays parameters) and from scanner errors (differences in the values of the focus and those that are achieved in the print structure, relative to the programmed ones)—as sources of errors. These errors are illustrated exemplarily in FIGS. 2A and 2B, illustrating the calibrated signal without and with and the scanner variation. The surface depicts the calculated focus-dose dependency and the points are the measurement points. The scanner variation as one factor causes a large variation which introduces a significant error and calculating the focus-dose dependency in the prior art.

Figure 3:
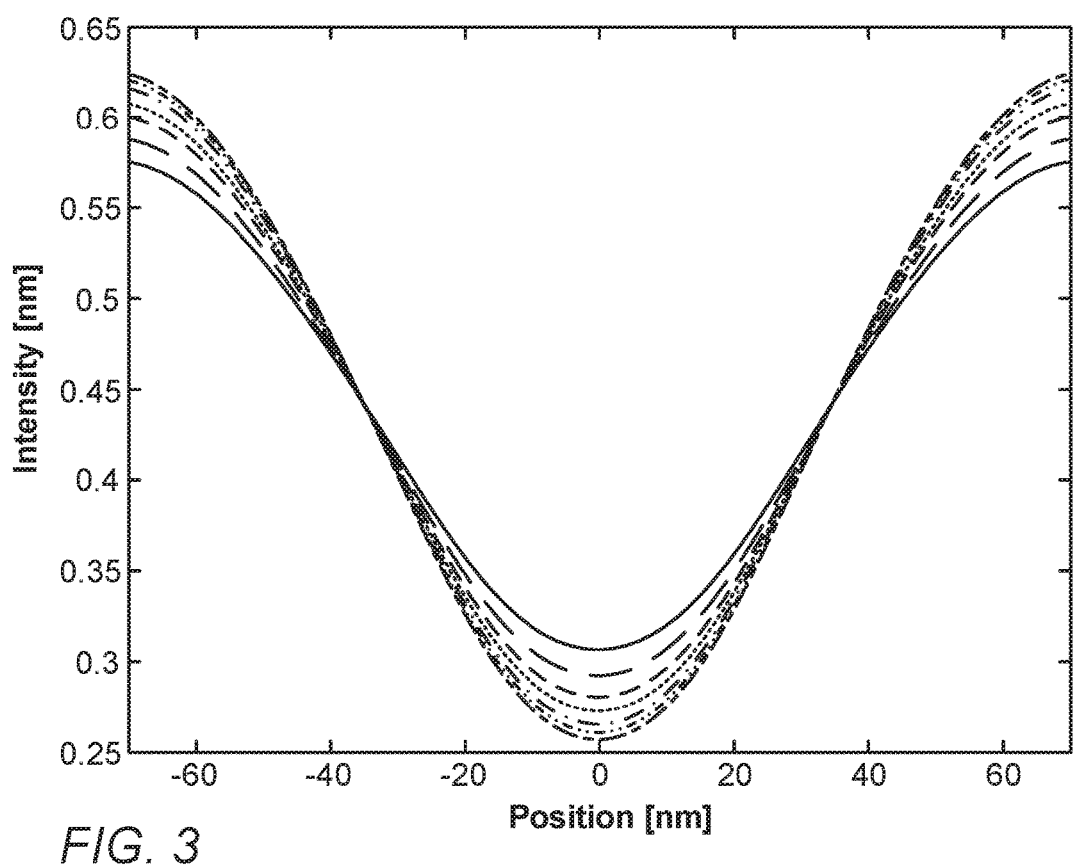
FIG. 3 is an exemplary illustration of computed aerial images of a single target element for varying focus values, used to derive transformation, according to some embodiments of the invention.

FIG. 3 is an exemplary illustration of computed aerial images 85 of a single target element for varying focus values, used to derive transformation 115, according to some embodiments of the invention. The inventors have found out that the aerial images of the cells may be used to achieve better calibration of the signals, as described below. The aerial image, which conveys the light intensity on the wafer, is computed for a periodic pattern using the mask and the scanner illumination scheme. The aerial images are not affected by the wafer process. Around a certain focus value, termed best focus, the intensity I(f, d) can be approximated as function of focus and dose as expressed by Equation 1, with f and d denoting the focus and dose off-set respectively, $d_0$ denotes a nominal dose and A, b, α and φ denote properties of the mask.

$$I(f,d)=[A+B\cos(\alpha f-\varphi)](d+d_0) \quad \text{Equation 1}$$

FIG. 3 illustrates aerial images 85 produced by a target element for various focus values.

For some cases, aerial images 85 of one cell, at a given focus and dose ($f_k$, $d_k$) can be created by another cell using different focus and dose values ($f_j$, $d_j$). If the two cells produce the same aerial image, the two cells also print the same grating pattern (target). An essential condition is that the two cells have the same pitch. Using computed aerial images 85, transformation 115 between the ($f_k$, $d_k$) of cell k to the ($f_j$, $d_j$) of cell j, may be expressed using the parameters of Equation 1, as provided by Equations 2, which may be designated as transformation 115 from j to k, ($f_j$, $d_j$)=$G^{k \to j}$ ($f_k$, $d_k$).

$$d_j = (A_k/A_j)d_k \quad \text{Equations 2}$$

$$f_j = (1/\alpha_j)[\cos^{-1}(\cos(\alpha_k f - \varphi_k)(B_k A_j/B_j A_k)) + \varphi_j].$$

Figure 4A:
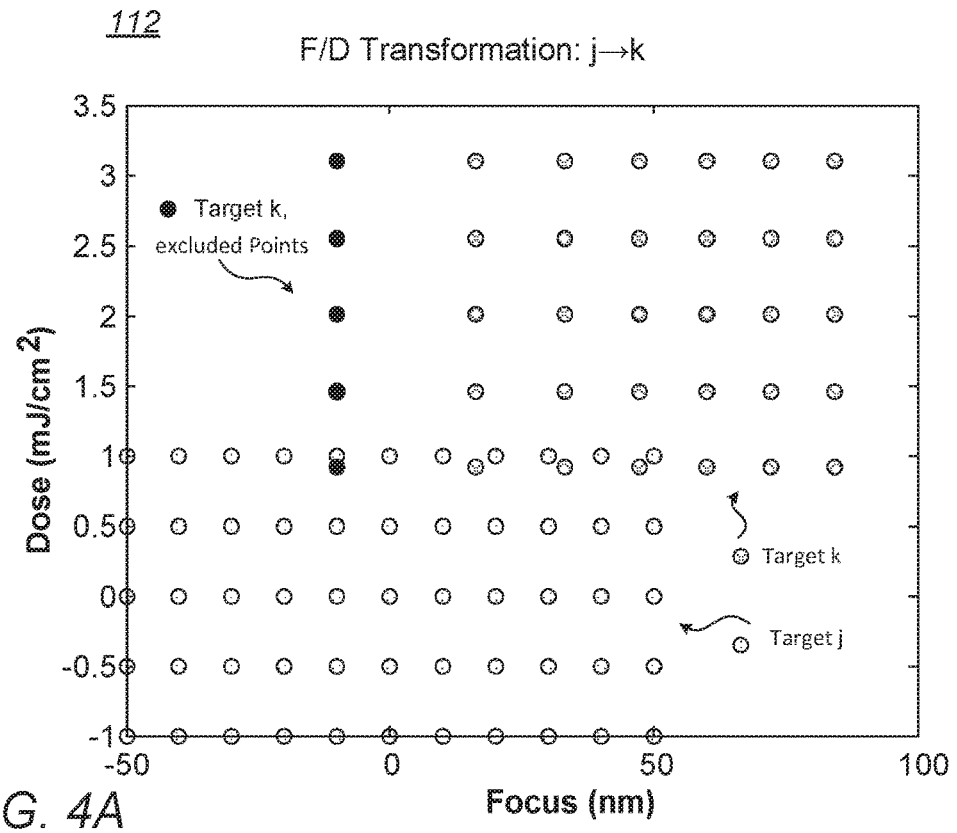
FIGS. 4A and 4B illustrate schematically a non-limiting example of transforming focus measurements of multiple targets into single set of results, using aerial-images-based transformation and resulting improved focus measurements, respectively, according to some embodiments of the invention.
Figure 4B:
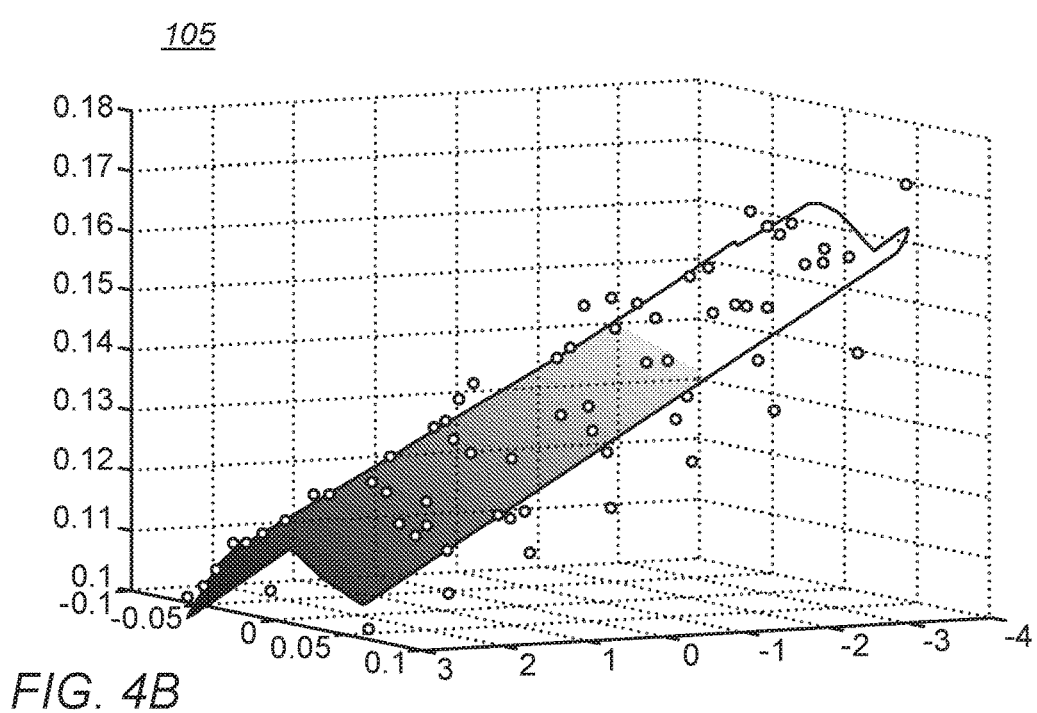

FIGS. 4A and 4B illustrate schematically a non-limiting example of transforming focus measurements 112 of multiple targets 101 into single set 118 of results, using aerial-images-based transformation 115 and resulting improved focus measurements 105, respectively, according to some embodiments of the invention. FIG. 4A illustrates ($f_j$, $d_j$) and ($f_k$, $d_k$) values for two targets which plotted together. Some of the points (($f_k$, $d_k$) values) for which the respective transformation doesn't exist may be excluded. During the calibration step of the signal measured with cell k, the calibration of cell j with focus ad dose values of ($f_j$, $d_j$) may be added to improve the accuracy of the focus and dose measurements, by relating to (transformed) measurements 112 from multiple target cells as a single set of measurements with more points than any of the single target measurements. FIG. 4B exemplifies improved calibrated signal 105, using the transformed signals (the surface illustrates the calculated focus dose dependency and the points indicate the measurements and the transformed measurements (see FIG. 5 for a more systematic comparison). Equation 3 expresses the use of transferred information between cells to provide the improved calibrated signal $SS_j$(f, d) of cell j, with the (f, d) which minimizes both the signals measured from cell j and cell k, when transformation 115 $G^{k \to j}$(f, d) is real and valid.

$$\min \Sigma_i[(SS_j(G^{k \to j}(f,d))-S_k^i)^2+(SS_j(f,d)-S_j^i)^2] \quad \text{Equation 3}$$

It is noted that while FIGS. 4A and 4B exemplify using transformation 115 with two cells, any number of cells may be used for calibration of the signal responses. The transformation of data between cells is not limited by the number of cells.

Figure 5:
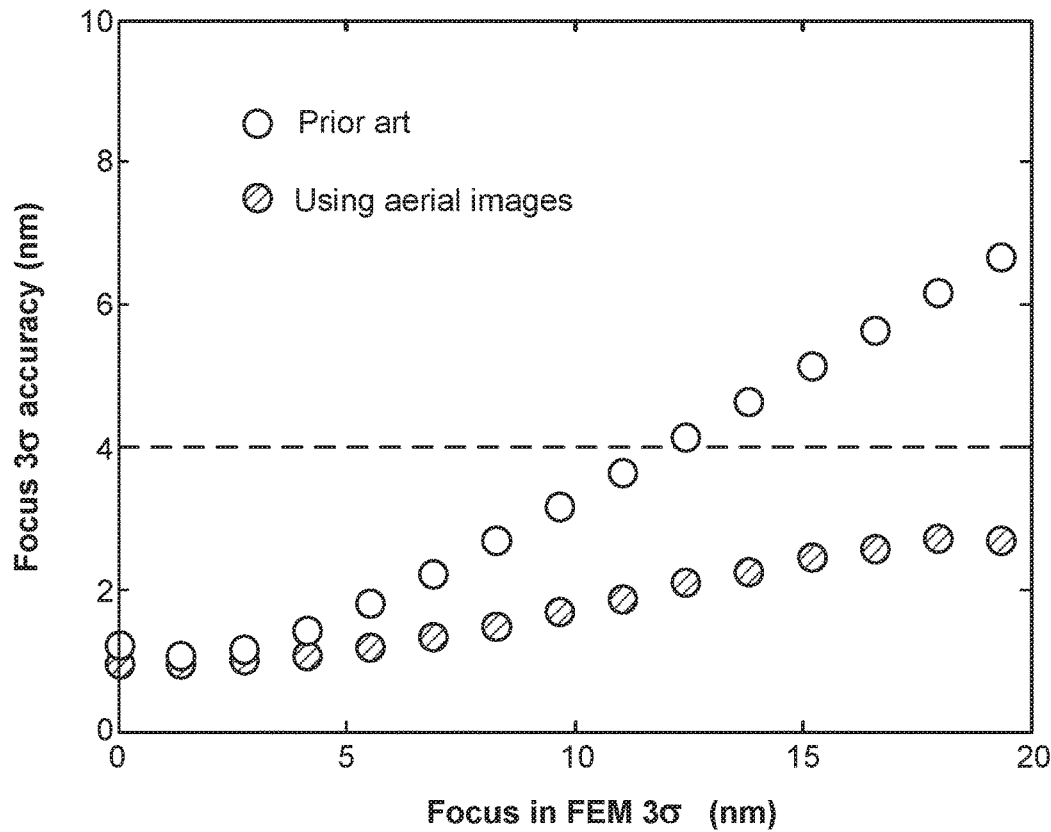
FIG. 5 is an exemplary illustration of the improved accuracy achieved using aerial-images-based transformation, according to some embodiments of the invention.

FIG. 5 is an exemplary illustration of the improved accuracy achieved using aerial-images-based transformation 115, according to some embodiments of the invention. Disclosed embodiments reduce ambiguities in the calibrated and measured signal, e.g., FIG. 5 presents the standard deviation of the focus error as a function the printed focus ambiguities in the FEM wafer, in the prior art and with using aerial-images-based transformation 115 to improve the accuracy of focus and dose measurements. The data is based on five targets which share their signal responses, a learning set of 55 different focus and dose combinations and 900 different signals per target. In this example the aerial images were used only to improve the calibration and not the measurement. In the illustrated example, especially large benefits are achieved for large ambiguities, in which the calibrated signal using aerial images is more resistant to ambiguities.

Concerning targets 120, the following disclosure provides ways of target selection and/or design which further enhance the accuracy and flexibility of focus dose measurements, using the principles disclosed above of using aerial-images-based transformations 115 to connect between target designs 120.

In the prior art, small pitch metrology targets are used in the scanner's focus measurement as well as for different types of measurements, such as aberration measurements, and may also be incorporated in targets of a larger pitch. However, finding a mask design of a printable and sensitive target (specific to the metrology) remains a main problem, in the following ways of easing the burden of finding such targets are provided, which simplify finding the mask designs of such targets given the design is known for some different illumination conditions and/or different mask type and/or different process window.

The following disclosure overcomes major disadvantages of the prior art such as the inapplicability of the empirical method (writing ca. 10,000 of different designs on a special reticle which is exactly of the type used later in production, writing the wafer using this mask, collecting metrology signals and rating the designs and choosing the best appropriate mask design) to handle rapidly changing products such as in foundry design. The changing product may require scanner illumination changes, mask type changes, under-layer stack changes, etc. which then require changing the focus dose wafer and/or the special reticle accordingly, thus requiring a long search to be conducted to find printable and sensitive metrology targets. The following disclosure overcomes major disadvantages of the prior art such as the requirement for very well calibrated lithography and metrology simulations in the simulations approach (using well calibrated lithography and metrology simulations find the best appropriate mask design for the metrology target). In particular, it is very difficult to achieve the resist calibration, which plays a crucial role in the simulations, at an appropriate level of accuracy. Moreover, the metrology target design, using detailed lithography and metrology simulations, is very resource and time consuming.

In contrast to the prior art methods, the inventors have found out that, assuming some specified targets are known, aerial-images-based transformations 115 may be used to derive additional appropriate targets 120. The specified targets must be printable (in the whole process window) and sensitive according to requirements, relating to given mask type(s) (e.g., a binary mask), resist (chemistry, physical properties (permittivity and permeability) and thickness), stack (TARC—top antireflective coating, BARC—bottom anti-reflective coating, and other underlayers including their thickness and physical properties—permittivity and permeability) and illumination conditions. The specified targets may be identified by a prior art method, such as the empirical method or the simulations method described above.

Aerial-images-based transformations 115 may be used to derive other targets 120 that have the same printability and sensitivity as previously found targets. This, assuming that TARC, Resist and BARC chemistry, thickness and physical properties remain unchanged (possibly unknown, but fixed) while any of the scanner illumination, mask type changes and/or the underlying stack (thickness or/and physical properties) change and/or the process window moves.

It is noted that a combination of target designs, mask type and illumination is equivalent to another such combination in the sense that it produces exactly the same grating geometry of the target, if these combinations induce the same aerial images. The aerial image of small pitch target designs is expressed by Equation 1A, with F denoting the focus, x denoting the x coordinate, $p_x$ denoting the pitch along the x direction and A, B, $F_0$ and $\alpha$ denoting corresponding parameters (see Equation 1 above, here the $\cos(x/2\pi p_x)$ is added to express the spatial dependence of the aerial image).

$$C+[A+B\cos(\alpha(F-F_0))]\cos(x/2\pi p_x) \quad \text{Equation 1A}$$

The parameters A, B, C, $\alpha$, $F_0$ and $p_x$ depend on the mask design, the mask stack and the illumination conditions. For the specified targets, which are verified target designs for specific combination(s) of illumination conditions and mask parameter, new mask(s) and targets possessing similar aerial image(s) may be derived, which maintain the same aerial image under a different combination of parameters A, B, C, $\alpha$, $F_0$ and $p_x$. In case of a process window move, $F_0$ may be additionally adjusted using a best focus depending constant, multiply the aerial image formula by a best dose depending coefficient.

Advantageously, the inventors have found out that using this method, the mask design with the prescribed aerial image may be carried out without any knowledge on the stack (including resist). The only information which is needed is the mask stack and illumination.

Figure 6:
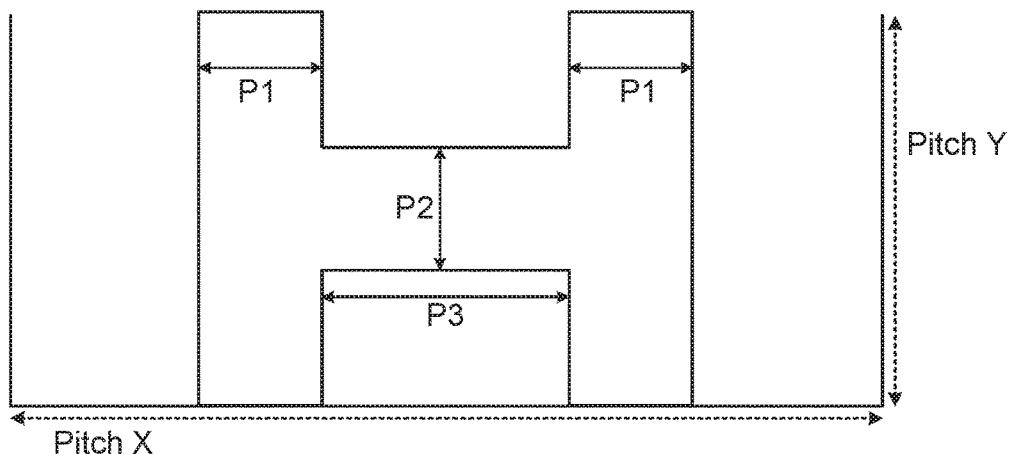
FIG. 6 illustrates schematically a possible multi-parametric mask design for carrying out the target optimization procedure, according to some embodiments of the invention.

FIG. 6 illustrates schematically a possible multi-parametric mask design 120A for carrying out the target optimization procedure, according to some embodiments of the invention. It is emphasized that similar analysis may be carried out for masks corresponding to any target design 120, as well as for targets 80A, 80B and other target types taught in U.S. Patent Publication No. 20140141536, which are incorporated herein by reference. The exemplary geometric parameters of mask 120A are denoted as P1, P2, P3 and Pitch X. In the optimization procedure, the mask parameters are varied to yield the same aerial image at different combinations of the parameters. It is noted that as the aerial image computation is very light operation computationally, the method is viable and efficient. Also, although the optimization problem may not be convex, using a mask template with enough parameters enables finding appropriate mask designs in most cases. Furthermore, if there is only a process window change, the optimization may be carried out over a smaller parametric range, e.g., Pitch X and a may be left constant (two-beam imaging effect), so that the number of aerial image parameters is smaller lowered (A, B, C and $F_0$).

Advantageously, the disclosed methods enable verification of printability and sensitivity of targets after minor illumination and mask stack changes, as well as the ability to carry out minor illumination changes on the fly, as verification of the printability and sensitivity of the targets is provided. Using the disclosed methods, neither empirical mask design search nor long simulation processes with very accurate calibration process are required.

In certain embodiments, the "image in resist" approximation may be used instead or in addition to the "aerial image" approximation. The methods may be implemented as a software tool, run e.g., by processing module 110 or as independent software, which may be used by developers and/or customers to improve the focus offset target design flow.

Figure 7:
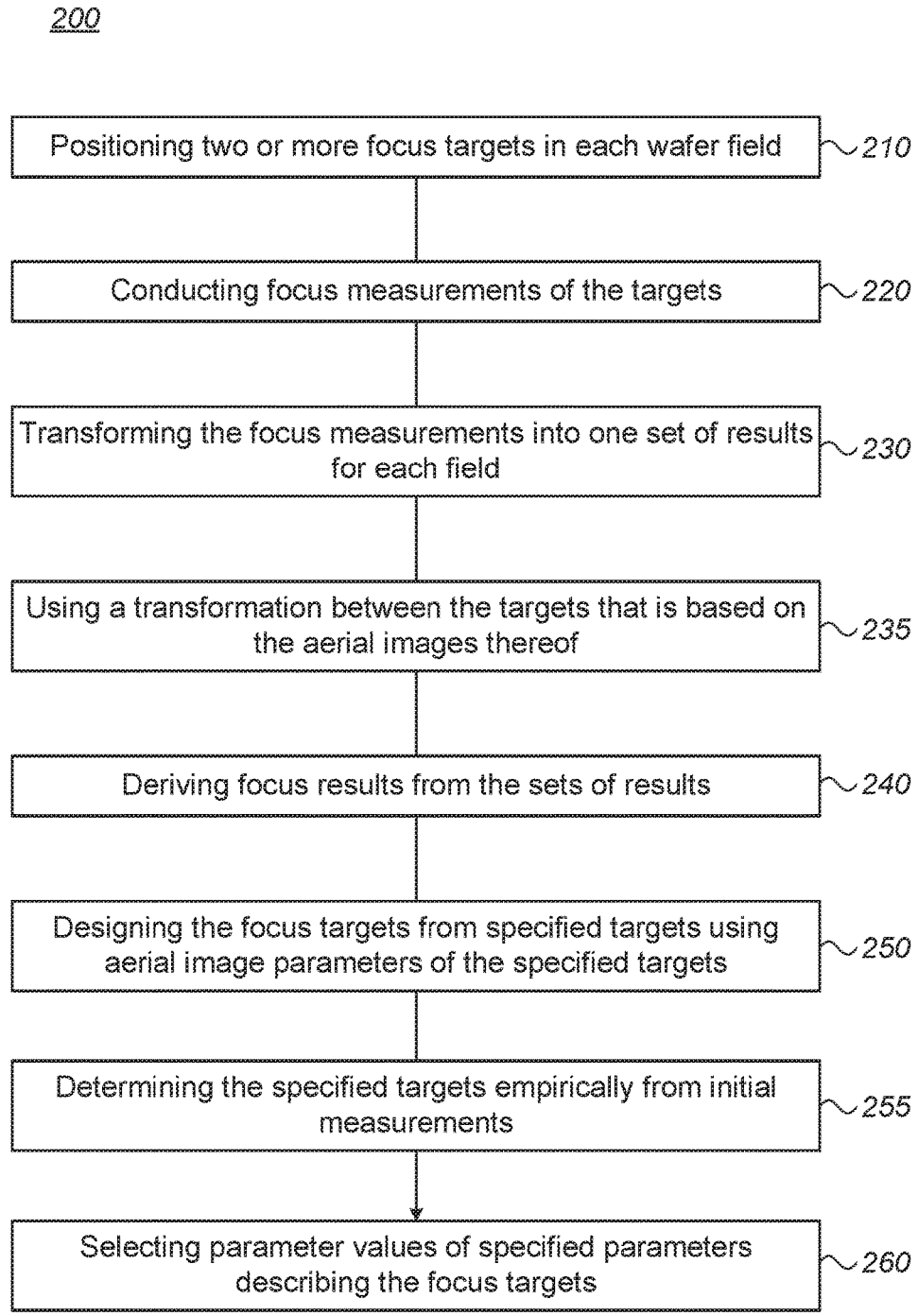
FIG. 7 is a high level flowchart illustrating a method, according to some embodiments of the invention.

FIG. 7 is a high level flowchart illustrating a method 200, according to some embodiments of the invention. The method stages may be carried out with respect to focus module 100 described above, which may optionally be configured to implement method 200. Method 200 may be at least partially implemented by at least one computer processor, e.g., by processing module 110 in metrology tool 90. Certain embodiments comprise computer program products comprising a computer readable storage medium having computer readable program embodied therewith and configured to carry out of the relevant stages of method 200. Certain embodiments comprise target design files of respective focus targets designed by embodiments of method 200.

Focus metrology method 200 comprises positioning two or more focus targets in each wafer field (stage 210), conducting focus measurements of the targets (stage 220), transforming the focus measurements into a single set of results for each field (stage 230), using a transformation between the targets that is based on the aerial images thereof (stage 235), and deriving focus results from the sets of results (stage 240).

Method 200 may further comprise designing the focus targets from specified targets using aerial image parameters of the specified targets (stage 250), e.g., from specified targets which are printable and sensitive according to specified requirements. The specified targets may be determined empirically from initial measurements (stage 255) and used to provide additional target using aerial-images-based transformations 115.

Method 200 may further comprise selecting parameter values of specified parameters describing the focus targets (stage 260), using aerial-images-based transformations 115, in order to design the focus targets to be equivalent to the specified targets.

Certain embodiments comprise target design files of focus targets designed according to method 200 and/or metrology focus/dose measurements of such targets.

Certain embodiments comprise metrology focus module 100 comprising processing module 110 configured to transform focus measurements of multiple targets positioned in a wafer field into a single set of results for the field, using a transformation between the targets that is based on aerial images of the targets, wherein the metrology focus module is configured to derive focus results from the single sets of results. In metrology focus module 100, processing module 110 may be further configured to suggest focus target designs according to specified targets using aerial image parameters of the specified targets, wherein the specified targets are determined empirically from initial measurements carried out by the metrology focus module.

Certain embodiments comprise a computer program product, e.g., in focus module 110, comprising a non-transitory computer readable storage medium having computer readable program embodied therewith, the computer readable program configured to transform focus measurements of multiple targets positioned in a wafer field into a single set of results for the field, using a transformation between the targets that is based on aerial images of the targets, and further to derive focus results from the single sets of results.

Certain embodiments comprise a computer program product, e.g., in focus module 110, comprising a non-transitory computer readable storage medium having computer readable program embodied therewith, the computer readable program configured to design focus targets from specified targets using aerial image parameters of the specified targets, by selecting parameter values of specified parameters describing the focus targets to provide same aerial images as the specified targets.

Aspects of the present invention are described above with reference to flowchart illustrations and/or portion diagrams of methods, apparatus (systems) and computer program products according to embodiments of the invention. It will be understood that each portion of the flowchart illustrations and/or portion diagrams, and combinations of portions in the flowchart illustrations and/or portion diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or portion diagram or portions thereof.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or portion diagram or portions thereof.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or portion diagram or portions thereof.

The aforementioned flowchart and diagrams illustrate the architecture, functionality, and operation of possible implementations of systems, methods and computer program products according to various embodiments of the present invention. In this regard, each portion in the flowchart or portion diagrams may represent a module, segment, or portion of code, which comprises one or more executable instructions for implementing the specified logical function(s). It should also be noted that, in some alternative implementations, the functions noted in the portion may occur out of the order noted in the figures. For example, two portions shown in succession may, in fact, be executed substantially concurrently, or the portions may sometimes be executed in the reverse order, depending upon the functionality involved. It will also be noted that each portion of the portion diagrams and/or flowchart illustration, and combinations of portions in the portion diagrams and/or flowchart illustration, can be implemented by special purpose hardware-based systems that perform the specified functions or acts, or combinations of special purpose hardware and computer instructions.

In the above description, an embodiment is an example or implementation of the invention. The various appearances of "one embodiment", "an embodiment", "certain embodiments" or "some embodiments" do not necessarily all refer to the same embodiments. Although various features of the invention may be described in the context of a single embodiment, the features may also be provided separately or in any suitable combination. Conversely, although the invention may be described herein in the context of separate embodiments for clarity, the invention may also be implemented in a single embodiment. Certain embodiments of the invention may include features from different embodiments disclosed above, and certain embodiments may incorporate elements from other embodiments disclosed above. The disclosure of elements of the invention in the context of a specific embodiment is not to be taken as limiting their use in the specific embodiment alone. Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described. Meanings of technical and scientific terms used herein are to be commonly understood as by one of ordinary skill in the art to which the invention belongs, unless otherwise defined. While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

What is claimed is:

1. A focus metrology method comprising:
   positioning two or more focus targets in each wafer field,
   conducting focus measurements of the targets,
   transforming the focus measurements into a single set of results for each field, using a transformation between the targets that is based on the aerial images thereof and is between $(f_k, d_k)$ of a first cell k to $(f_j, d_j)$ of a second cell j, wherein f represents a focus and d represents a dose, and
   deriving focus results from the single sets of results.

2. The method of claim 1, further comprising designing the focus targets from specified targets using aerial image parameters of the specified targets.

3. The method of claim 2, further comprising determining the specified targets empirically from initial measurements.

4. The method of claim 2, wherein the designing comprises selecting parameter values of specified parameters describing the focus targets.

5. A target design file of targets designed according to claim 2.

6. The method of claim 1, carried out at least partially by at least one computer processor.

7. The method of claim 1, wherein the transformation is described as from j to k, $(f_j, d_j)=G^{k \rightarrow j}(f_k, d_k)$, wherein the transformation is expressed by the equations $d_j=(A_k/A_j)d_k$ and $f_j=(1/\alpha_j)[\cos^{-1}(\cos(\alpha_k f-\varphi_k)(B_k A_j/B_j A_k))+\varphi_j]$, and wherein A, B, $\alpha$, and $\varphi$ are properties of a mask.

8. The method of claim 1, wherein the focus results include a best focus of intensity I(f, d).

9. The method of claim 8, wherein best focus of intensity is expressed by the equation $I(f, d)=[A+B\cos(\alpha f-\varphi)](d+d_0)$, wherein do denotes a nominal dose, and wherein A, B, α, and φ are properties of a mask.

10. The method of claim 1, further comprising excluding points where the transformation does not exist.

11. A metrology focus module comprising a processing module configured to transform focus measurements of multiple targets positioned in a wafer field into a single set of results for the field, using a transformation between the targets that is based on aerial images of the targets and is between $(f_k, d_k)$ of a first cell k to $(f_j, d_j)$ of a second cell j, wherein f represents a focus and d represents a dose, wherein the metrology focus module is configured to derive focus results from the single sets of results.

12. The metrology focus module of claim 11, wherein the processing module is further configured to suggest focus target designs according to specified targets using aerial image parameters of the specified targets, wherein the specified targets are determined empirically from initial measurements carried out by the metrology focus module.

13. The metrology focus module of claim 11, wherein the transformation is described as from j to k, $(f_j, d_j)=G^{k\rightarrow j}(f_k, d_k)$, wherein the transformation is expressed by the equations $d_j=(A_k/A_j)d_k$ and $f_j=(1/\alpha_j)[\cos^{-1}(\cos(\alpha_k f-\varphi_k)(B_k A_j/B_j A_k))+\varphi_j]$, and wherein A, B, α, and φ are properties of a mask.

14. The metrology focus module of claim 11, wherein the focus results include a best focus of intensity I(f, d), wherein best focus of intensity is expressed by the equation $I(f, d)=[A+B \cos(\alpha f-\varphi)](d+d_0)$, wherein do denotes a nominal dose, and wherein A, B, α, and φ are properties of a mask.

15. A computer program product comprising a non-transitory computer readable storage medium having computer readable program embodied therewith, the computer readable program configured to transform focus measurements of multiple targets positioned in a wafer field into a single set of results for the field, using a transformation between the targets that is based on aerial images of the targets and is between $(f_k, d_k)$ of a first cell k to $(f_j, d_j)$ of a second cell j, wherein f represents a focus and d represents a dose, and further to derive focus results from the single sets of results.

16. A metrology focus module comprising the computer program product of claim 15.

17. The computer program product of claim 15, wherein the transformation is described as from j to k, $(f_j, d_j)=G^{k\rightarrow j}(f_k, d_k)$, wherein the transformation is expressed by the equations $d_j=(A_k/A_j)d_k$ and $f_j=(1/\alpha_j)[\cos^{-1}(\cos(\alpha_k f-\varphi_k)(B_k A_j/B_j A_k))+\varphi_j]$, and wherein A, B, α, and φ are properties of a mask.

18. The computer program product of claim 15, wherein the focus results include a best focus of intensity I(f, d), wherein best focus of intensity is expressed by the equation $I(f, d)=[A+B \cos(\alpha f-\varphi)](d+d_0)$, wherein do denotes a nominal dose, and wherein A, B, α, and φ are properties of a mask.

19. A computer program product comprising a non-transitory computer readable storage medium having computer readable program embodied therewith, the computer readable program configured to design focus targets from specified targets using aerial image parameters of the specified targets, by selecting parameter values of specified parameters describing the focus targets to provide same aerial images as the specified targets wherein the design focus targets are based on a transformation between the targets that is based on the aerial images thereof and is between $(f_k, d_k)$ of a first cell k to $(f_j, d_j)$ of a second cell j, wherein f represents a focus and d represents a dose.

20. A metrology focus module comprising the computer program product of claim 19.

* * * * *